(12) United States Patent
Mansour et al.

(10) Patent No.: US 9,246,510 B2
(45) Date of Patent: Jan. 26, 2016

(54) APPARATUS AND METHOD FOR MULTILEVEL CODING IN COMMUNICATION SYSTEMS

(71) Applicant: Texas Instruments Incorporated, Dallas, TX (US)

(72) Inventors: Mohamed F. Mansour, Richardson, TX (US); Lars Jorgensen, Royal Oaks, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/502,011

(22) Filed: Sep. 30, 2014

(65) Prior Publication Data

US 2015/0092879 A1   Apr. 2, 2015

Related U.S. Application Data

(60) Provisional application No. 61/885,351, filed on Oct. 1, 2013.

(51) Int. Cl.
| | |
|---|---|
| *H04L 25/49* | (2006.01) |
| *H03M 5/18* | (2006.01) |
| *H03M 13/15* | (2006.01) |
| *H03M 13/25* | (2006.01) |
| *H04L 27/36* | (2006.01) |
| *H03M 13/13* | (2006.01) |

(52) U.S. Cl.
CPC .............. *H03M 5/18* (2013.01); *H03M 13/251* (2013.01); *H04L 25/4917* (2013.01); *H04L 27/364* (2013.01); *H03M 13/13* (2013.01); *H03M 13/152* (2013.01); *H03M 13/255* (2013.01); *H04L 27/36* (2013.01)

(58) Field of Classification Search
CPC ............ H04L 25/4917; H04L 25/4925; H04L 1/0618; H04B 7/06669
USPC ........... 375/286.286, 295, 299, 316; 714/773, 714/776
See application file for complete search history.

(56) References Cited

U.S. PATENT DOCUMENTS

| | | |
|---|---|---|
| 5,150,381 A | 9/1992 | Forney, Jr. et al. |
| 5,195,107 A | 3/1993 | Wei |
| 5,214,672 A | 5/1993 | Eyuboglu et al. |
| 8,347,186 B1 | 1/2013 | Arikan |

(Continued)

OTHER PUBLICATIONS

Ionita, et al.; U.S. Appl. No. 14/503,547; "Apparatus and Method for Multilevel Coding (MLC) with Binary Alphabet Polar Codes"; filed Oct. 1, 2014; 51 pages.

(Continued)

*Primary Examiner* — Khai Tran
(74) *Attorney, Agent, or Firm* — Lawrence J. Bassuk; Frank D. Cimino

(57) ABSTRACT

A method includes receiving input blocks each having multiple bits to be transmitted. The method also includes applying a first encoding scheme to a first subset of the bits in the input blocks to generate first encoded bits and applying a second encoding scheme to a second subset of the bits in the input blocks to generate second encoded bits. The second encoding scheme has lower overhead than the first encoding scheme. The method further includes generating symbols using the first and second encoded bits. The first encoded bits include two or more first bits per symbol of each output block, and the second encoded bits include one or more second bits per symbol of each output block.

21 Claims, 7 Drawing Sheets

(56) References Cited

U.S. PATENT DOCUMENTS

| | | | |
|---|---|---|---|
| 8,719,670 B1* | 5/2014 | Marrow | 714/773 |
| 8,787,477 B2 | 7/2014 | Mansour et al. | |
| 2007/0143654 A1* | 6/2007 | Joyce et al. | 714/752 |
| 2012/0250785 A1* | 10/2012 | Vidal et al. | 375/295 |
| 2013/0145231 A1* | 6/2013 | Frayer et al. | 714/763 |
| 2014/0177740 A1 | 6/2014 | Mansour et al. | |
| 2014/0281832 A1* | 9/2014 | Zhang et al. | 714/776 |

OTHER PUBLICATIONS

Ionita, et al.; U.S. Appl. No. 14/503,513; "Apparatus and Method for Supporting Polar Code DEsigns"; filed Oct. 1, 2014; 36 pages.

Miller, et al.; "End-to-End Communication Test on Variable Length Packet Structures Utilizing AOS Testbed"; Third International Symposium on Space Mission Operations and Ground Data Systems; Nov. 1994; 9 pages.

Prodan, et al.; "Forward Error Correction Proposal for EPOC Phy Layer"; printed from http://www.ieee802.org/3/bn/public/sept12/prodan_01b_0912.pdf; Broadcom; IEEE 802.3bn EPoC; Sep. 2012; 13 pages.

Arikan, E.; "Channel Polarization: A Method for Constructing Capacity-Achieving Codes for Symmetric Binary-Input Memoryless Channels"; IEEE Transactions on Information Theory; vol. 55; Jul. 2009; 23 pages.

Arikan, et al.; "On the Rate of Channel Polarization"; IEEE International Symposium on Information Theory; No. 2; Jun. 2009; 5 pages.

Hassani, et al.; "Rate-Dependent Analysis of the Asymptotic Behavior of Channel Polarization"; IEEE Transactions on Information Theory; vol. 59; Apr. 2013; 10 pages.

Sasoglu, et al.; "Polarization for Arbitrary Discrete Memoryless Channels"; IEEE Information Theory Workshop; vol. 2; 2009; 5 pages.

Leroux, et al.; "A Semi-Parallel Successive-Cancellation Decoder for Polar Codes"; IEEE Transactions on Signal Processing; vol. 61; Jan. 2013; 11 pages.

Wachsmann, et al.; "Multilevel Codes: Theoretical Concepts and Practical Design Rules"; IEEE Transactions on Information Theory; vol. 45; Jul. 1999; 31 pages.

Shin, et al.; "Mapping Selection and Code Construction for 2m-ary Polar-Coded Modulation"; IEEE Communications Letters; vol. 16; Jun. 2012; 4 pages.

Seidl, et al.; "Polar-Coded Modulation"; printed from http://arxiv.org/abs/1302.2855v1; Feb. 2013; 11 pages.

Mori, et al.; "Performance of Polar Codes with the Construction Using Density Evolution"; IEEE Communications Letters; vol. 13; Jul. 2009; 3 pages.

Korada, et al.; "Polar Codes: Characterization of Exponent, Bounds, and Constructions"; IEEE Transactions on Information Theory; vol. 56; Dec. 2010; 12 pages.

Tal, et al.; "How to Construct Polar Codes"; printed from http://arxiv.org/abs/1105.6164; May 2011; 21 pages.

Mori, et al.; "Performance and Construction of Polar Codes on Symmetric Binary-Input Memoryless Channels"; IEEE International Symposium on Information Theory; IEEE; Jun. 2009; 5 pages.

Tal, et al.; "List Decoding of Polar Codes"; Information Theory Proceedings (ISIT); IEEE International Sumposium; 2011; 11 pages.

Kumar, et al. "A GPU Implementation of Belief Propagation Decoder for Polar Codes"; Signals, Systems and Computers (ASILOMAR); Conference Record of the Forty Sixth Asilomar Conference; 2012; 5 pages.

Goldsmith, et al. "Adaptive Coded Modulation for Fading Channels"; IEEE Transactions on Communications; vol. 46; May 1998; 8 pages.

"3rd Generation Partnership Project; Technical Specification Group Radio Access Network; Evolved Universal Terrestrial Radio Access (E-UTRA); Multiplexing and Channel Coding"; 3GPP TS 36.212; Release 9.2.0; Jun. 2010; 61 pages.

Sasoglu, E.; "An Entropy Inequality for q-ary Random Variables and its Application to Channel Polarization"; IEEE International Symposium on Information Theory; IEEE; Jun. 2010; 4 pages.

Sasoglu, E.; "Polar Codes for Discrete Alphabets"; IEEE Iinternational Symposium on Information Theory Proceedings; vol. 1; Jul. 2012; 5 pages.

"Forward Error Correction Proposal for EPOC Phy Layer", Richard S. Prodan, et al., IEEE 802.3bn EPoC, Sep. 2012, pp. 1-13 (http://www.ieee802.org/3/bn/public/sep12/prodan_01c_0912.pdf#page=3).

* cited by examiner

APPARATUS AND METHOD FOR MULTILEVEL CODING IN COMMUNICATION SYSTEMS

CROSS-REFERENCE TO RELATED APPLICATION AND PRIORITY CLAIM

This application claims priority under 35 U.S.C. §119(e) to U.S. Provisional Patent Application No. 61/885,351 filed on Oct. 1, 2013. This provisional patent application is hereby incorporated by reference in its entirety.

TECHNICAL FIELD

This disclosure is generally directed to communication systems. More specifically, this disclosure is directed to an apparatus and method for multilevel coding (MLC) in communication systems.

BACKGROUND

Many modern wireless and other communication systems encode digital data for transmission over communication paths. For example, various communication systems map data bits into symbols, where the symbols define different locations within a constellation. A single symbol represents multiple data bits, and larger numbers of bits per symbol result in larger constellation sizes. A receiver that receives the transmitted symbols over a communication path uses knowledge of the constellation to convert the received symbols back into data bits. The overall efficiency of a coding technique is often important in meeting speed or throughput requirements for communications. Unfortunately, conventional coding techniques typically have overall coding efficiencies that unnecessarily limit the speed or throughput of communications.

SUMMARY

This disclosure provides an apparatus and method for multilevel coding (MLC) in communication systems.

In a first embodiment, a method includes receiving input blocks each having multiple bits to be transmitted. The method also includes applying a first encoding scheme to a first subset of the bits in the input blocks to generate first encoded bits and applying a second encoding scheme to a second subset of the bits in the input blocks to generate second encoded bits. The second encoding scheme has lower overhead than the first encoding scheme. The method further includes generating symbols using the first and second encoded bits. The first encoded bits include two or more first bits per symbol of each output block, and the second encoded bits include one or more second bits per symbol of each output block.

In a second embodiment, an apparatus includes a first encoder configured to apply a first encoding scheme to a first subset of bits from multiple input blocks to generate first encoded bits. The apparatus also includes a second encoder configured to apply a second encoding scheme to a second subset of the bits in the input blocks to generate second encoded bits, where the second encoding scheme has lower overhead than the first encoding scheme. The apparatus further includes a modulator configured to map the first and second encoded bits to symbols for transmission. The first encoded bits include two or more first bits per symbol of each output block, and the second encoded bits include one or more second bits per symbol of each output block.

In a third embodiment, a method includes receiving symbols over a communication channel. The method also includes applying a first decoding scheme to decoding information obtained using the symbols to generate first decoded bits, where the first decoded bits include two or more first bits of recovered data per symbol for each of multiple output blocks. The method further includes applying a second decoding scheme to codewords obtained using the symbols and the first decoded bits to generate second decoded bits. The second decoded bits include one or more second bits of recovered data per symbol for each of the output blocks, and the second decoding scheme has lower overhead than the first decoding scheme. The method further includes outputting the output blocks.

In a fourth embodiment, an apparatus includes a first decoder configured to receive symbols and apply a first decoding scheme to decoding information obtained using the symbols to generate first decoded bits, where the first decoded bits include two or more first bits of recovered data per symbol for each of multiple output blocks. The apparatus also includes a second decoder configured to apply a second decoding scheme to codewords obtained using the symbols and the first decoded bits to generate second decoded bits. The second decoded bits include one or more second bits of recovered data per symbol for each of the output blocks, and the second decoding scheme has lower overhead than the first decoding scheme.

Other technical features may be readily apparent to one skilled in the art from the following figures, descriptions, and claims.

BRIEF DESCRIPTION OF THE DRAWINGS

For a more complete understanding of this disclosure and its features, reference is now made to the following description, taken in conjunction with the accompanying drawings, in which.

DETAILED DESCRIPTION

FIGS. 1 through 9, discussed below, and the various embodiments used to describe the principles of the present invention in this patent document are by way of illustration only and should not be construed in any way to limit the scope of the invention. Those skilled in the art will understand that the principles of the present invention may be implemented in any suitable manner and in any type of suitably arranged device or system.

Figure 1:
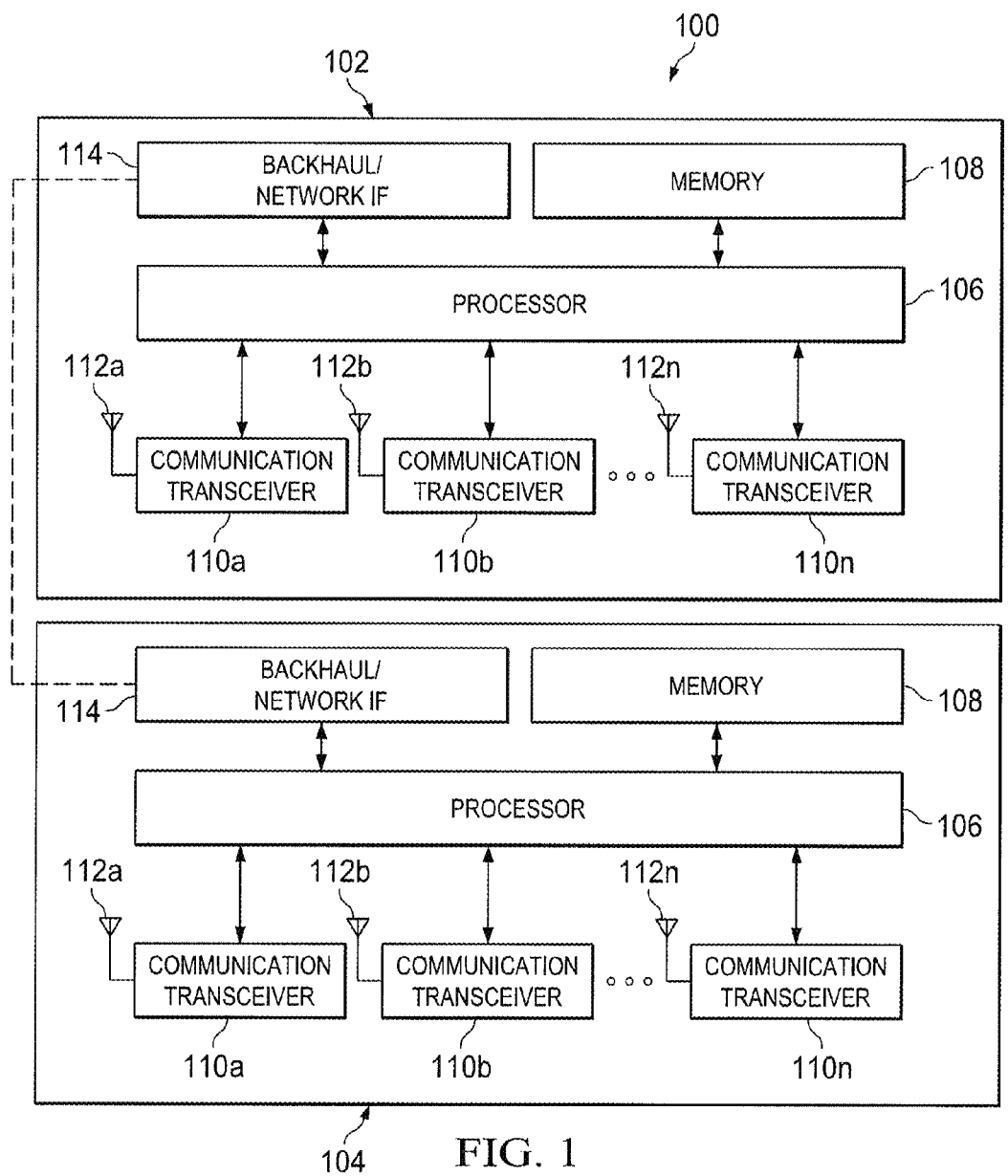
FIG. 1 illustrates an example system that uses multilevel coding (MLC) for wireless or other communications in accordance with this disclosure.

FIG. 1 illustrates an example system 100 that uses multilevel coding (MLC) for wireless or other communications in accordance with this disclosure. As shown in FIG. 1, communications occur between two base stations 102-104. However, this is for illustration only, and the techniques described in this patent document could be used to support MLC for communications between any suitable devices or systems.

Each base station 102-104 shown in FIG. 1 generally denotes an infrastructure component that provides wireless service to one or more wireless devices. Other types of infrastructure components that are encompassed by the phrase "base station" include enhanced Node Bs (eNBs) and access points. Similarly, a base station can communicate with any number of wireless devices, each of which generally denotes a device that receives wireless service from at least one infrastructure component. Other types of devices that are encompassed by the phrase "wireless device" include mobile stations, user equipment, wireless terminals, or other fixed or mobile devices. The base stations 102-104 could communicate using any suitable protocol(s) supporting the use of MLC.

As shown in FIG. 1, each base station 102-104 includes at least one processing device 106 and at least one memory 108. The at least one processing device 106 executes logic in order to control the overall operation of the base station 102-104 and to support communications with wireless devices. The exact operations of the processing device(s) 106 can vary depending on, for example, the protocol(s) supported by the base stations 102-104. Each processing device 106 includes any suitable processing or control device, such as a microprocessor, microcontroller, digital signal processor (DSP), field programmable gate array (FPGA), application specific integrated circuit (ASIC), or discrete logic devices. The at least one memory 108 stores instructions and data used, generated, or collected by the base station 102-104. Each memory 108 includes any suitable volatile or non-volatile storage and retrieval device, such as a random access memory (RAM) or a Flash or other read-only memory (ROM).

Each base station 102-104 also includes multiple communication transceivers 110a-110n, each of which (if implemented to support wireless communications) may be coupled to at least one of multiple antennas 112a-112n. Each communication transceiver 110a-110n supports communications with other devices, such as portable or other wireless devices. Each communication transceiver 110a-110n includes any suitable structure supporting communications over one or more wired or wireless communication channels. For example, each communication transceiver 110a-110n can include transmit circuitry that facilitates the transmission of signals from the communication transceiver and receive circuitry that facilitates the processing of signals received by the communication transceiver. Each antenna 112a-112n represents any suitable structure for transmitting and receiving communication signals, such as a radio frequency (RF) antenna. Note that while each communication transceiver 110a-110n is shown here as having its own antenna 112a-112n, multiple communication transceivers could share one or more common antennas, or each communication transceiver could have multiple antennas.

A backhaul interface 114 supports communications between the base stations 102-104 themselves or between a base station 102-104 and other component(s) via a backhaul network. For example, the backhaul interface 114 could allow the base stations 102-104 to communicate with one another. The backhaul interface 114 includes any suitable structure for facilitating communications over a backhaul network, such as a microwave communications unit or an optical fiber interface.

As noted above, the overall efficiency of a coding technique is often important in meeting speed or throughput requirements for communications. Most conventional coding techniques employ equal protection for all bits being transmitted in symbols over connections. However, in reality, more protection is needed for the least significant bits in the data being transmitted. The least significant bits are more likely to change between neighboring symbols and are therefore more vulnerable to errors. More significant bits in the data being transmitted are less likely to change between neighboring symbols and are therefore less vulnerable to errors. Providing equal protection for all bits therefore tends to unnecessarily reduce system speed and throughput.

In accordance with this disclosure, a multilevel coding system is provided that uses different coding techniques for different bits being transmitted as symbols over one or more communication channels, where the different coding techniques provide different levels of protection. For example, stronger protection can be provided to a number of least significant bits in the symbols being transmitted, which are the bits more vulnerable to errors. Weaker protection can be provided to at least some of the remaining bits in the data being transmitted, which are the bits less vulnerable to errors. The stronger protection has a higher overhead than the weaker protection, meaning fewer information bits are transported over a connection when using the stronger protection. As a particular example, a low-density parity-check (LDPC) code can be used with a number of least significant bits that are more vulnerable, and a Bose, Chaudhuri and Hocquenghem (BCH) code can be used with at least some of the remaining bits. However, any other suitable linear block codes (such as polar codes, Reed-Solomon codes, or Reed-Muller codes) could be used in the multilevel coding system. In addition, various types of constellations can be used to support the communication of symbols over one or more communication channels. The constellation(s) used with a particular communication channel could be designed so that the distance between symbols with the same values in their least significant bits is increased or maximized.

This approach allows stronger protection to be used only with the bits of data that are more likely to experience errors. Weaker protection can be used for bits that are less likely to experience errors, which helps to improve spectral efficiency and increase system speed and throughput. Moreover, the number of bits receiving the stronger protection can be selected flexibly or dynamically, which allows the appropriate selection of bits as circumstances vary. In addition, increasing or maximizing the distance between symbols with common least significant bits in a constellation can further increase system speed and throughput by reducing the number of bits to be decoded. Other or additional benefits or features can be obtained depending on the implementation of the transmitting and receiving devices.

Communications to or from a base station, wireless device, or other device can occur using MLC with any suitable symbol constellation(s), such as square quadrature amplitude modulation (QAM), cross QAM, 8-QAM, or circular QAM. Although the following description describes the use of MLC with QAM constellations for inter-base station communications via their backhaul interfaces 114, MLC with QAM constellations can be used to support any suitable communications with any suitable devices or systems over physical or wireless communication links.

Although FIG. 1 illustrates one example of a system 100 that uses MLC for wireless or other communications, various changes may be made to FIG. 1. For example, the approach for MLC described in this patent document could be used in any suitable system. Moreover, infrastructure components and networks come in a wide variety of designs and configurations, and FIG. 1 does not limit the scope of this disclosure to any particular base station or network configuration.

Figure 2:
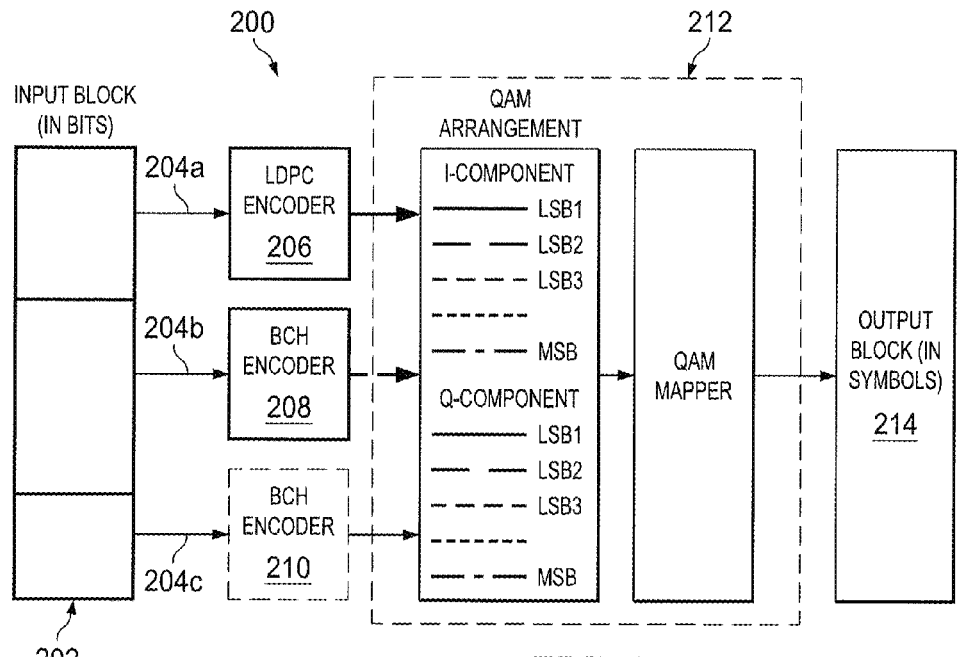
FIGS. 2 and 3 illustrate example encoding and decoding schemes that use MLC for wireless or other communications in accordance with this disclosure.
Figure 3:
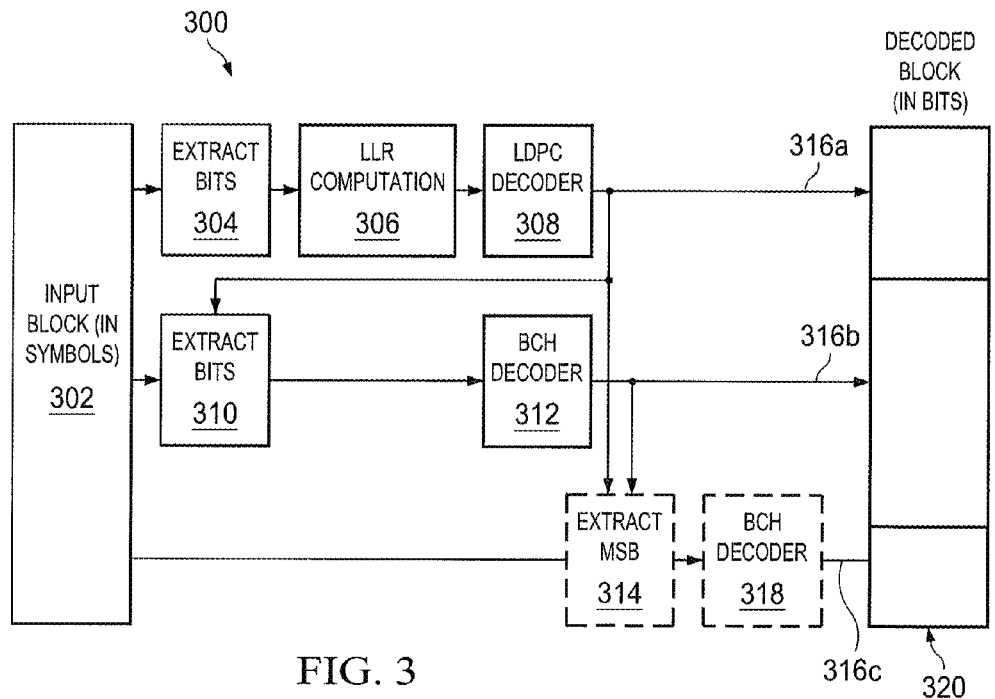

FIGS. 2 and 3 illustrate example encoding and decoding schemes that use MLC for wireless or other communications in accordance with this disclosure. In particular, FIG. 2 illustrates an example encoder 200 that uses MLC for wireless communications, and FIG. 3 illustrates an example decoder 300 that uses MLC for wireless communications. The encoder 200 and the decoder 300 could be used in any suitable devices or systems, such as in the base stations 102-104 of FIG. 1.

As shown in FIG. 2, the encoder 200 receives input blocks 202, each of which contains a number of bits to be transmitted over at least one channel. The bits in each input block 202 include least significant bits (LSBs) 204a, more significant bits 204b, and most significant bit (MSBs) 204c. In general, there are at least two least significant bits 204a and at least one more/most significant bits 204b-204c in each input block 202.

An encoder 206 providing a first level of protection processes the least significant bits 204a to generate first codewords, and a second encoder 208 providing a second level of protection processes at least the more significant bits 204b to generate second codewords. In some embodiments, the most significant bits 204c remain uncoded and are passed directly to a modulator 212. In other embodiments, the most significant bits 204c are combined with the more significant bits 204b and processed by the same encoder 208. In still other embodiments, the most significant bits 204c are provided to a third encoder 210, which could provide the same level of protection as the second encoder 208 or an even weaker form of protection than the second encoder 208.

In some embodiments, each input block 202 can be provided in its entirety to the second encoder 208, which generates the second codewords and then discards portions of the second codewords associated with the least significant bits 204a. For instance, assume an input block 202 is defined as $x=[x_1, x_2]$, where $x_1$ represents the least significant bits 204a and $x_2$ represents the more/most significant bits 204b-204c. The size of $x_1$ is denoted $M_1$. In some embodiments, $x_1$ is provided to the encoder 206 in order to generate an LDPC codeword defined as $y_1=[x_1, p_1]$, and the entire input block 202 is provided to the encoder 208 in order to generate a BCH codeword defined as $y_2=[x_1, x_2, p_2]$. The BCH codeword can then be trimmed to remove the LDPC information bits to generate a trimmed BCH codeword defined as $z_2=[x_2, p_2]$ (a process which may also correct some errors from the LDPC). A similar process could be used by the encoder 210 to generate other BCH codewords that are then trimmed to remove the information bits associated with the bits 204a-204b.

Each encoder 206-210 represents any suitable structure for encoding bits using a specified coding scheme. In this example, the encoder 206 represents an LDPC encoder, the encoder 208 represents a BCH encoder, and the optional encoder 210 represents another BCH encoder. However, each encoder 206-210 could be implemented in any other suitable manner.

The modulator 212 receives the encoded bits from the encoders (and possibly one or more uncoded bits) and generates output blocks 214 containing symbols. The modulator 212 implements any suitable modulation technique to generate the symbols, such as M-ary QAM (M-QAM). In this example, the modulator 212 represents a QAM modulator that arranges the incoming bits into suitable form and then maps the arranged bits into symbols. In particular, the modulator 212 arranges the incoming bits into in-phase (I) and quadrature (Q) components (in-phase and quadrature are often referred to below as different "directions"). In the particular example described above, for MLC-2 coding in which symbols are arranged in 2×2 cells in a constellation, the different bits of $y_1$ go to the least significant bit position in each direction, and the different bits of $z_2$ go to the most significant bit position in each direction. For MLC-4 coding in which symbols are arranged in 4×4 cells in a constellation, two bits of $y_1$ go to the two least significant bit positions in each direction. The modulator 212 includes any suitable structure for modulating codewords to generate symbols. The symbols in the output blocks 214 are transmitted over at least one communication channel, which suffers from noise that can create errors in the transmitted symbols.

As shown in FIG. 3, the decoder 300 receives input blocks 302, each of which represents a collection of symbols in an output block 214 from the encoder 200 after transmission over at least one channel. Due to noise or other issues, an input block 302 may not exactly match its corresponding output block 214.

A first extractor 304 extracts portions of the input blocks 302, and a log-likelihood ratio (LLR) calculator 306 calculates LLR values for the extracted portions of the input blocks 302. The LLR values represent decoding information used by a first decoder 308 to decode two or more least significant bits per symbol and generate two or more decoded least significant bits 316a per symbol for each decoded output block 320. The decoded bits 316a and the input blocks 302 are provided to a second extractor 310, which extracts other portions of the input blocks 302. The data output by the second extractor 310 could, for example, represent trimmed BCH codewords with the LDPC bits removed. This data is provided to a second decoder 312, which generates at least one decoded more significant bit 316b per symbol for each decoded output block 320. If the most significant bit(s) of the received data remain(s) to be processed, a third extractor 314 extracts yet other portions of the input blocks 302, which could represent at least one decoded most significant bit 316b for each decoded output block 320.

Note that this assumes no BCH decoding of the most significant bit(s) is needed, although an additional decoder 318 could be used to provide such decoding. The decoder 318 could receive the outputs of the decoders 308, 312 and decode the most significant bit(s) from the input blocks 302 extracted by the third extractor 314. Also note that all of the more/most significant bits could be encoded by the same encoder 208, and the components 314, 318 could be omitted. The extracted bits 316a-316c for each input block 302 collectively form a decoded output block 320, which (ideally) matches a corresponding input block 202.

In some embodiments, the decoder 308 represents an LDPC decoder that outputs $[x_1, p_1]$ data recovered from LDPC codewords $y_1$. Also, in some embodiments, the extractor 310 represents a hard-decision unit that uses the $[x_1, p_1]$ data to recover $[x_2, p_2]$ data, and the extractor 310 combines the $x_1$ data with the $[x_2, p_2]$ data to recover a BCH codeword $y_2$. In addition, in some embodiments, the decoder 312 represents a BCH decoder that operates using the recovered BCH codewords $y_2$.

Each extractor 304, 310, 314 represents any suitable structure for extracting data from symbols. The LLR calculator 306 includes any suitable structure for performing LLR calculations. Each decoder 308, 312, 318 includes any suitable structure for decoding data.

The components shown in FIGS. 2 and 3 could be implemented in any suitable manner. For example, the components shown in FIGS. 2 and 3 could be implemented using only hardware components or a combination of hardware and software/firmware instructions. As particular examples, the components shown in FIGS. 2 and 3 could be implemented using one or more FPGAs, ASICs, or other hardware-only components. The components shown in FIGS. 2 and 3 could also be implemented using one or more processing devices that execute software/firmware instructions for performing the described functions. A combination of approaches could also be used, such as when some components are implemented using only hardware and other components are implemented using one or more processing devices that execute software/firmware instructions.

Although FIGS. 2 and 3 illustrate examples of encoding and decoding schemes that use MLC for wireless or other communications, various changes may be made to FIGS. 2 and 3. For example, the use of LDPC, BCH, and QAM are for illustration only, and other encoding, decoding, or modulation techniques could be used. As particular examples, any other suitable linear block codes (such as polar codes, Reed-Solomon codes, or Reed-Muller codes) could be supported in the encoding and decoding schemes.

Figure 4:
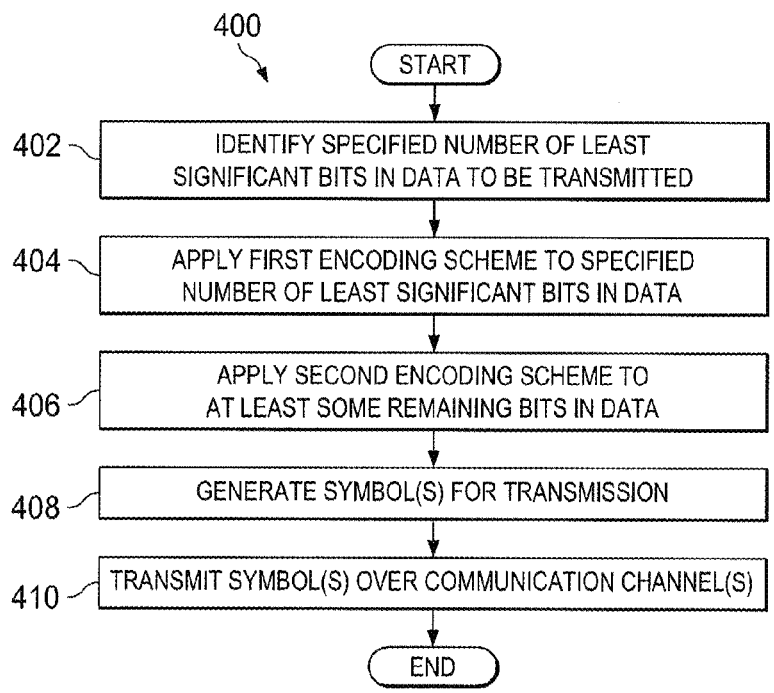
FIGS. 4 and 5 illustrate example methods using MLC for wireless or other communications in accordance with this disclosure.
Figure 5:
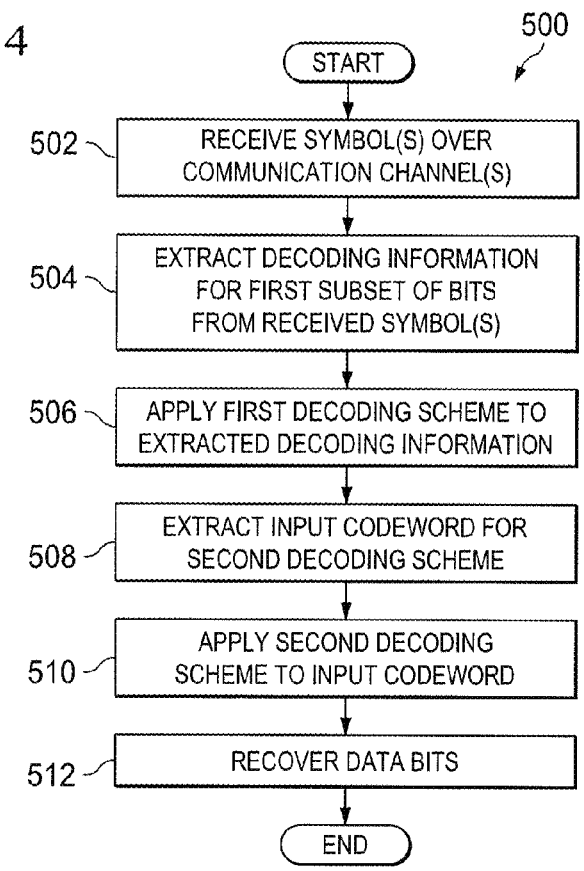

FIGS. 4 and 5 illustrate example methods using MLC for wireless or other communications in accordance with this disclosure. In particular, FIG. 4 illustrates an example method 400 that could be used by an encoder supporting MLC, and FIG. 5 illustrates an example method 500 that could be used by a decoder supporting MLC. For ease of explanation, these methods 400 and 500 are described with respect to the encoder 200 and decoder 300, respectively. However, the methods 400 and 500 could be used by any other suitable devices.

As shown in FIG. 4, a specified number of least significant bits in data to be transmitted is identified at step 402. This could include, for example, identifying between two and six least significant bits in the data to be transmitted. The exact number could vary depending on the circumstances, such as based on characteristics of the communication channel(s) over which the data is to be transmitted.

A first encoding scheme is applied to the specified number of least significant bits in the data to be transmitted at step 404. This could include, for example, the encoder 206 applying LDPC coding or other encoding that offers a higher level of protection (and thus has a larger amount of overhead). A second encoding scheme is applied to at least some of the remaining bits in the data to be transmitted at step 406. This could include, for example, the encoder 208 applying BCH coding or other encoding that offers a lower level of protection (and thus has a smaller amount of overhead). Note that this step may or may not include encoding at least one most significant bit in the data to be transmitted. If all remaining bits in the data to be transmitted are encoded, the encoding could be common for all remaining bits, or different subsets of the remaining bits could be encoded differently.

One or more symbols are generated at step 408. This could include, for example, performing QAM mapping to map the encoded bits (and possibly some uncoded bits) to one or more QAM symbols. The one or more symbols are transmitted over at least one communication channel at step 410.

As shown in FIG. 5, one or more symbols are received over at least one communication channel at step 502. Decoding information for a first subset of bits is extracted from the received symbols at step 504. This could include, for example, the LLR calculator 306 identifying LLR values using information from the first extractor 304. A first decoding scheme is applied to the extracted decoding information at step 506. This could include, for example, the decoder 308 decoding various least significant bits using the LLR values.

An input codeword for a second decoding scheme is extracted at step 508. This could include, for example, the second extractor 310 performing a hard-decision, combining the results of the hard-decision with the decoded bits from the decoder 308, and generating a trimmed BCH codeword with the LDPC bits removed. The second decoding scheme is applied to the input codeword at step 510. This could include, for example, the decoder 312 decoding at least some of the received information using BCH decoding and optionally the third decoder 318 decoding at least one most significant bit. One or more blocks of data bits are thereby recovered at step 512. This could include, for example, the decoder 300 outputting one or more decoded output blocks 320 containing the bits from the various decoders.

Although FIGS. 4 and 5 illustrate examples of methods 400 and 500 using MLC for wireless or other communications, various changes may be made to FIGS. 4 and 5. For example, while shown as a series of steps, various steps in each figure could overlap, occur in parallel, or occur any number of times. Also, as noted above, any other suitable linear block codes (such as polar codes, Reed-Solomon codes, or Reed-Muller codes) could be supported in the encoding and decoding schemes.

As shown in FIGS. 2 through 5, different coding techniques are used with different bits being transmitted over one or more communication channels. This increases the effective code rate (and hence the speed and throughput of the system) by assigning more protection to more vulnerable bits and less protection to more reliable bits. In these examples, a combination of LDPC coding for more vulnerable bits and BCH coding for less vulnerable bits (along with residual error from the LDPC) have been used, although other coding techniques could be used.

The number of bits subjected to the different coding schemes in the encoder 200 and decoder 300 could vary. For example, assume q bits are transmitted per QAM symbol. Table 1 shows an example of the number of bits per symbol that could undergo LDPC and BCH encoding in two configurations, namely MLC-2 and MLC-4.

TABLE 1

|  | LDPC | BCH |
|---|---|---|
| MLC-2 | 2 | q if q >2, otherwise 0 |
| MLC-4 | min(4, q) | q if q >4, otherwise 0 |

The following provides additional details regarding one example implementation of the encoder 200 and the decoder 300 using LDPC and BCH coding techniques. The size of an input block 202 can be determined based on the LDPC block size, the BCH block size, the MLC order (such as MLC-2 or MLC-4), and the QAM order. Denote the LDPC encoder input and output block sizes by $M_1$ and $N_1$, respectively (meaning the LDPC code rate is $M_1/N_1$). LDPC coding uses $M_1$ information bits and generates $N_1$ code bits. Frequently, other system constraints may necessitate the use of an LDPC block with a smaller code block size, which could be accommodated by code shortening in which the same number of parity bits and fewer information bits are transmitted. Let b denote the MLC order, where b bits per symbol are assigned to LDPC. The overall number of symbols in an FEC block that contains the LSBs can be expressed as:

$$S = \lceil N_1/b \rceil \quad (1)$$

where $\lceil x \rceil$ denotes the ceiling integer function (the smallest integer greater than or equal to x). It is also possible to have additional tail symbols with no information in the least significant bits if needed to construct a frame. There are also typically overhead symbols (such as cyclic prefix, fast control message, and channel estimation update) that shorten the number of symbols in the FEC block. If the QAM order is $2^q$ (q bits per symbol), the output block size in bits becomes:

$$B = S \times q \quad (2)$$

To accommodate different coding possibilities, the BCH output block size can be fixed (such as at $2^{15}-1$ or 32,767 bits) and shortened if needed for different coding requirements. The BCH codeword contains the bits of data being transmitted except the least significant bits, as well as the systematic part of the LDPC codeword. If q>b, the output BCH block size can be expressed as:

$$N_2 = M_1 + (q-b) \times S \quad (3)$$

where S is the overall number of symbols per FEC block as in Equation (1). Because a fixed-size BCH encoder/decoder is being used, the amount of shortening can be defined as:

$$B = 32767 - N_2 \quad (4)$$

If the BCH code can correct up to t bit errors, the input BCH block size can be expressed as:

$$M_2 = N_2 - 15t \quad (5)$$

Note that the input block size of the MLC is the same as the BCH input block size. Example values of t could be 12 for MLC-2 and 6 for MLC-4. Table 2 shows various characteristics of the BCH encoder for different MLC orders and QAM values.

TABLE 2

|  | "t" Value | QAM Order "q" | Input Block Size (after shortening) "$M_2$" | Block Shortening "B" | BCH Code Rate "$M_2/N_2$" |
| --- | --- | --- | --- | --- | --- |
| MLC-2 | 12 | 16 | 6960 | 25627 | 0.975 |
|  | 12 | 32 | 9000 | 23587 | 0.980 |
|  | 12 | 64 | 11040 | 21547 | 0.984 |
|  | 12 | 128 | 13080 | 19507 | 0.986 |
|  | 12 | 256 | 15120 | 17467 | 0.988 |
|  | 12 | 512 | 17160 | 15427 | 0.990 |
|  | 12 | 1024 | 19200 | 13387 | 0.991 |
|  | 12 | 2048 | 21240 | 11347 | 0.992 |
|  | 12 | 4096 | 23280 | 9307 | 0.992 |
| MLC-4 | 6 | 32 | 3900 | 28687 | 0.956 |
|  | 6 | 64 | 4920 | 27667 | 0.965 |
|  | 6 | 128 | 5940 | 26647 | 0.971 |
|  | 6 | 256 | 6960 | 25627 | 0.975 |
|  | 6 | 512 | 7980 | 24607 | 0.978 |
|  | 6 | 1024 | 9000 | 23587 | 0.980 |
|  | 6 | 2048 | 10020 | 33567 | 0.982 |
|  | 6 | 4096 | 11040 | 21547 | 0.984 |

The overall code rate of the MLC configuration can be expressed as:

$$\upsilon = M_2/(N_2 + M_1 - N_1) \quad (6)$$

Examples of the code rates of different block sizes are shown in Table 3 below for 1024-QAM and 256-QAM, respectively. Additional overhead bits and symbols are not considered here.

Note that while encoding the BCH component, the shortened part can be set to zero at the beginning of the overall block. For example, for a (19200, 19380) BCH code with a shortening of 13387, the first 13,387 entries of the input block are set to zero, and a standard (32587, 32767) BCH encoder is used with the systematic bits at the beginning. Then, the first 13,387 bits of the output block are removed before symbol mapping. At the decoder, these zero bits are added to the received block before running a standard (32587, 32767) BCH decoder, and they are removed from the decoded information bits. Also note that, for BCH, code shortening can be done implicitly since padding with zeros at the beginning does not alter any states.

In general, the MLC approach described above for using multiple coding techniques for different bits can be used with any suitable constellation of symbols. FIGS. 6 through 9 illustrate example constellations that can be used during MLC for wireless or other communications in accordance with this disclosure. Note, however, that any other suitable constellations could also be used.

Figure 6:
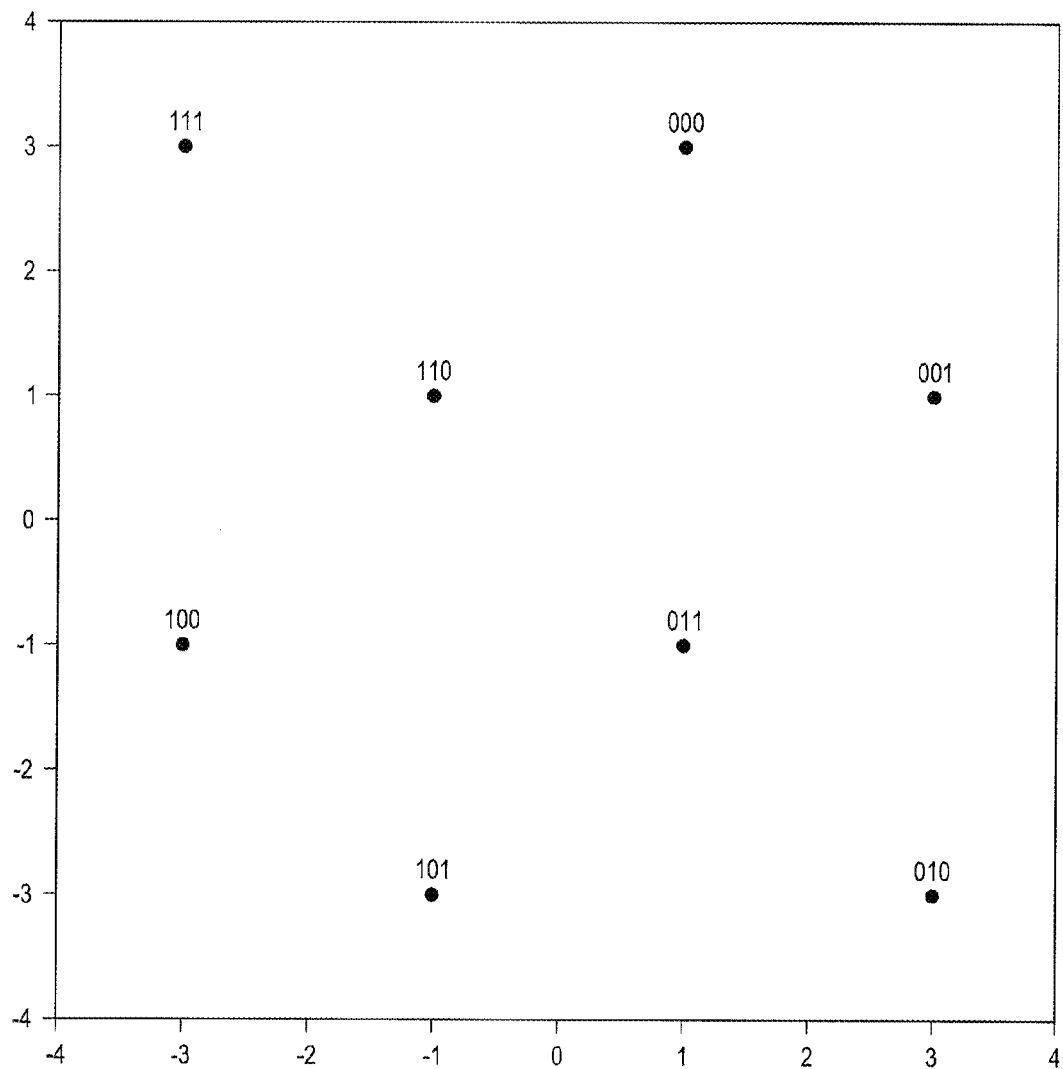
FIGS. 6 through 9 illustrate example constellations that can be used during MLC for wireless or other communications in accordance with this disclosure.

As shown in FIG. 6, a constellation 600 represents a staggered constellation. This constellation 600 uses a staggered layout to maximize the distance between constellation points for a given power level. As each constellation point is used to represent three bits, the constellation 600 supports a total of $2^3$ or eight different constellation points, making this an 8-QAM constellation.

Figure 7:
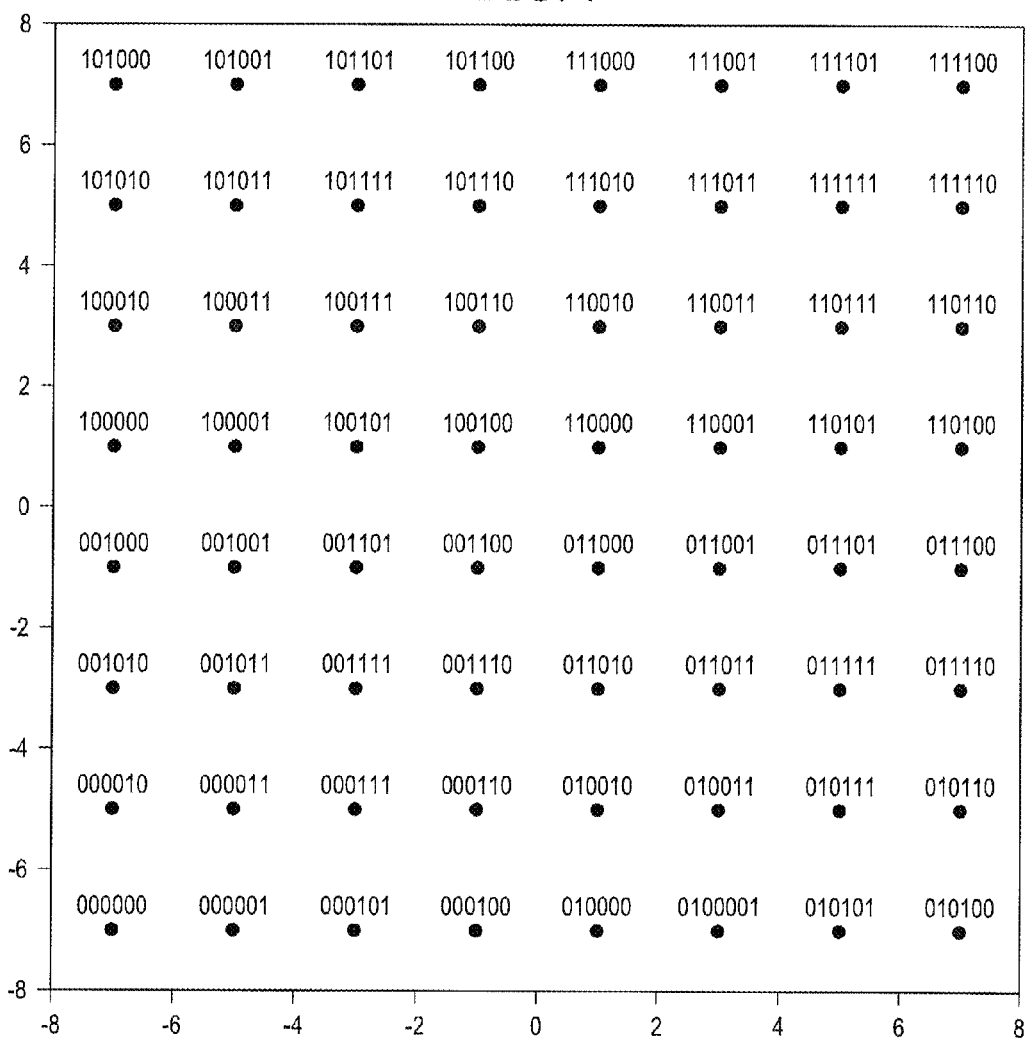

As shown in FIG. 7, a constellation 700 represents a square constellation. This constellation 700 uses constellation points in rows and columns, where all rows and columns have the same number of constellation points. A square constellation can be used when the constellation size is an even power of two, such as 4, 16, 64, 256, 1024, and 4096. In this example, each constellation point is used to represent six bits, and the constellation 700 supports a total of $2^6$ or 64 different constellation points, making this a 64-QAM constellation. The processing of each axis in this case is completely independent for the MLC-2 and MLC-4 configurations. With proper scaling, the constellation points on each axis are at $\{-2^{q/2}+1, -2^{q/2}+3, \ldots, -1, +1, +3, \ldots, +2^{q/2}-1\}$, where each constellation point is associated with a codeword of size q bits.

Figure 8:
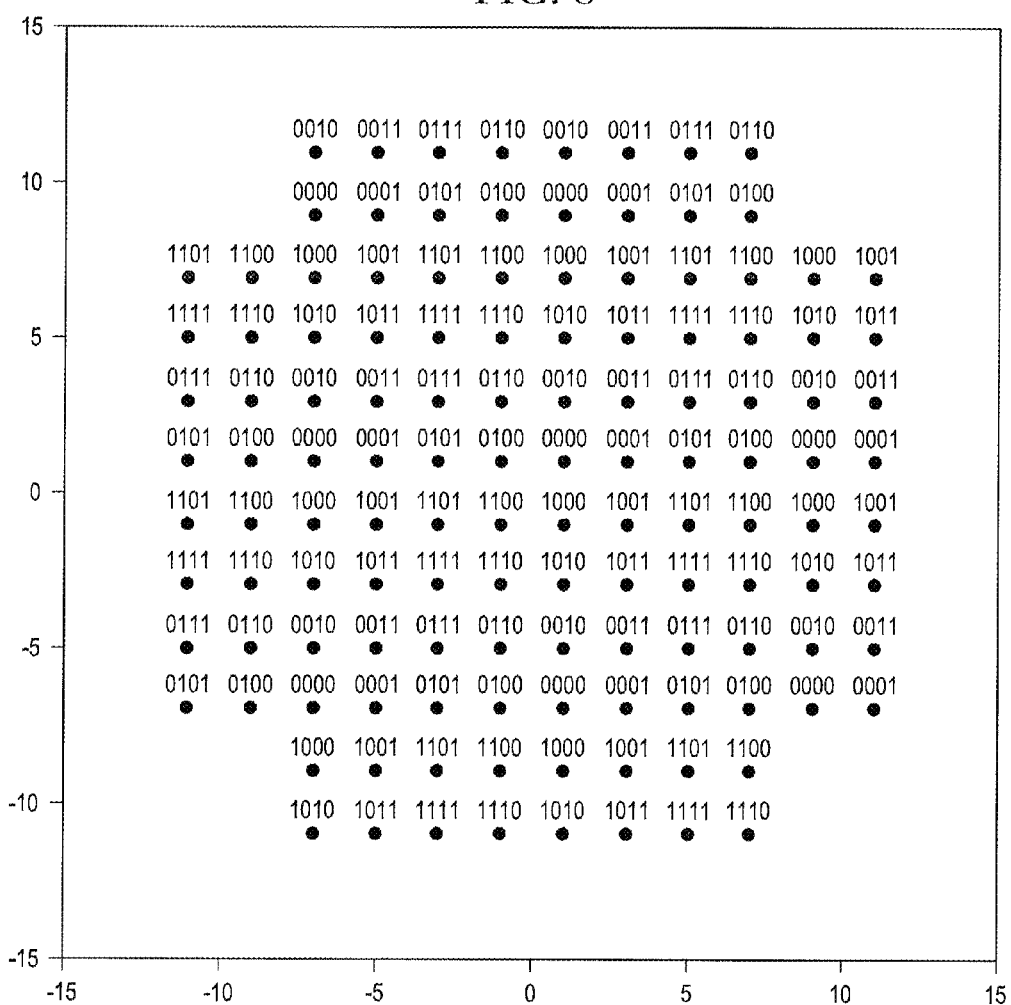

As shown in FIG. 8, a constellation 800 represents a cross constellation. This constellation 800 uses constellation points in rows and columns, where central rows have more constellation points than outer rows and central columns have more constellation points than outer columns. A cross constellation can be used when the constellation size is an odd power of two, such as 32, 128, 512, and 2048. In this example, each constellation point is used to represent seven bits (only the four least significant bits are shown in FIG. 8), and the constellation 800 supports a total of $2^7$ or 128 different constel-

TABLE 3

|  | LDPC | LDPC Code Rate | BCH | BCH Code Rate | Output block Size (symbols) | Input Block Size (bits) | Output Block Size (bits) | Effective Code Rate |
| --- | --- | --- | --- | --- | --- | --- | --- | --- |
| MLC-2 | (3060, 4080) | 0.75 | (19200, 19380) | 0.988 | 2040 | 19200 | 20400 | 0.941 |
|  | (3570, 4080) | 0.875 | (19710, 19890) | 0.991 | 2040 | 19710 | 20400 | 0.966 |
|  | (2040, 2550) | 0.8 | (12060, 12240) | 0.985 | 1275 | 12060 | 12750 | 0.946 |
| MLC-4 | (3060, 4080) | 0.75 | (9000, 9180) | 0.980 | 1020 | 9000 | 10200 | 0.882 |
|  | (3570, 4080) | 0.875 | (9510, 9690) | 0.981 | 1020 | 9510 | 10200 | 0.932 |
|  | (2040, 2550) | 0.8 | (5688, 5868) | 0.970 | 638 | 5688 | 6380 | 0.892 | lation points. This is therefore a 128-QAM constellation, where the boundaries are at levels $P_1=7$ and $P_2=11$. For longer-axis regions, the constellation points are at $\{-P_2, -P_2+2, \ldots, -1, +1, \ldots, +P_2-2, +P_2\}$. For smaller-axis regions, the constellation points are at $\{-P_1, -P_1+2, \ldots, -1, +1, \ldots, +P_1-2, +P_1\}$.

Figure 9:
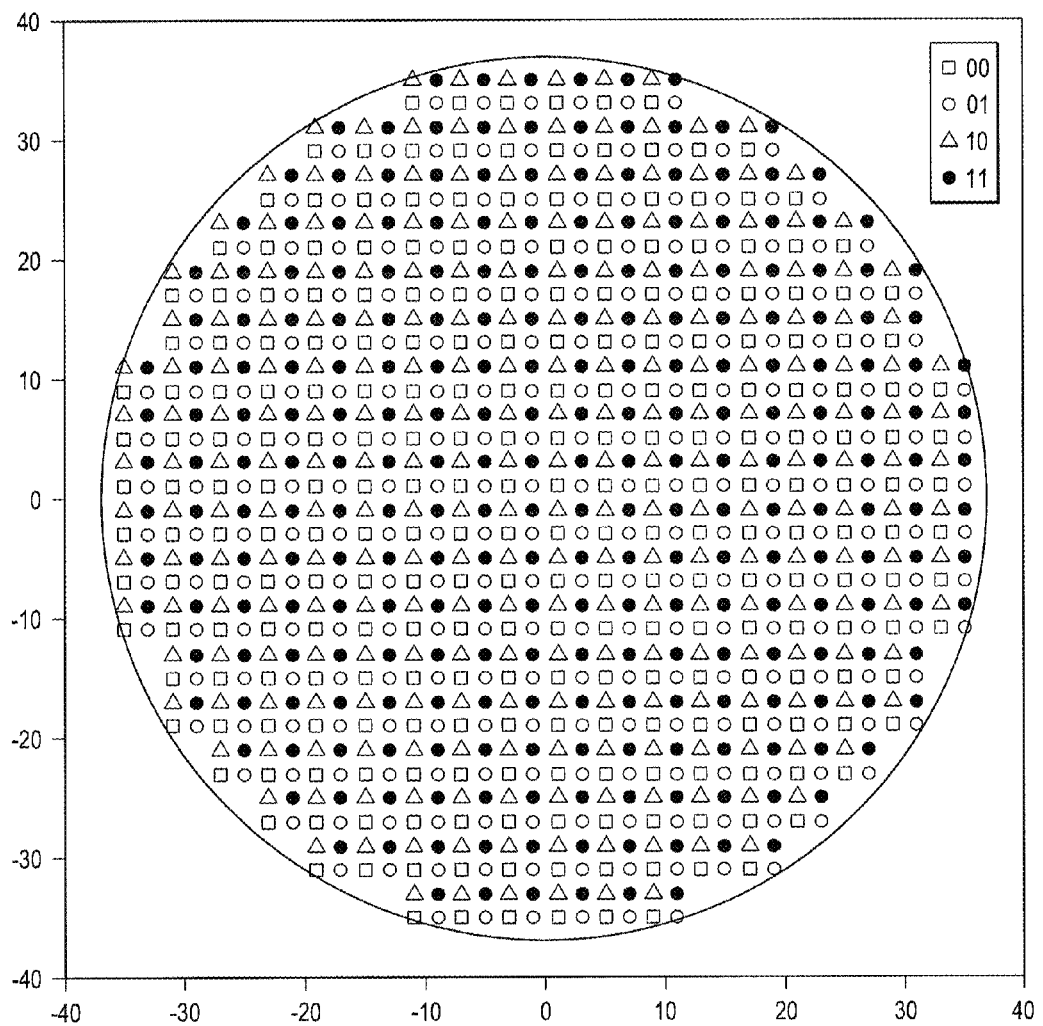

As shown in FIG. 9, a constellation 900 represents a circular constellation, where only the least significant bits of the symbols are shown. This constellation 900 again uses constellation points in rows and columns. Central rows have more constellation points, and the remaining rows gradually decrease in the number of constellation points moving up or down. Central columns have more constellation points, and the remaining columns gradually decrease in the number of constellation points moving right or left. A circular constellation has a shape along its outer region that generally resembles a circle.

Depending on the constellation, MLC-2 or MLC-4 can be used to represent bit values of the constellation points. In MLC-2, constellation points are grouped into 2-by-2 subsets or "cells." In some embodiments, the least significant bits of the constellation points can be arranged with the form:

$$\begin{bmatrix} 10 & 11 \\ 00 & 01 \end{bmatrix}$$

In MLC-4, constellation points are grouped into 4-by-4 cells. In some embodiments, the least significant bits of the constellation points can be arranged with the form:

$$\begin{bmatrix} 1000 & 1001 & 1101 & 1100 \\ 1010 & 1011 & 1111 & 1110 \\ 0010 & 0011 & 0111 & 0110 \\ 0000 & 0001 & 0101 & 0100 \end{bmatrix}$$

The labeling of the least significant bits in these ways follows a gray coding arrangement. In either case, additional bits can be used to identify different cells within the constellation, where each cell has one of these two patterns. For instance, in FIG. 7, two additional bits can be used to uniquely identify one of four instances of the second pattern, where the two additional bits follow the first pattern shown above.

For implementation purposes, the outer points of a circular constellation (such as the constellation 900) can include 2×2 cells of constellation points, rather than individual points as is common in conventional circular constellations. In FIG. 9, the constellation 900 represents a 1024-QAM constellation, although other sizes (such as 256, 2048, or 4096) could be used. Note that the circular constellation 900 is generally symmetric for the positive and negative values but not symmetric across its two axes. For example, in FIG. 9, eight constellation points have the maximum edge value of 51 for the I-axis, while twelve constellation points have the maximum edge value for the Q-axis. However, this need not be the case.

The MLC coding technique described above can be used with any underlying constellation, including any of the constellations shown here. When LDPC and BCH coding techniques are used, any underlying constellation can be used as long as LLR values can be calculated for decoding the least significant bits and the more/most significant bits can be extracted via BCH decoding. As noted above, each constellation (including staggered constellations) can be partitioned into 2×2 cells (for MLC-2) or 4×4 cells (for MLC-4), where each cell has one or more common most significant bits for all constellation points within that cell. The least significant bits within each cell can be gray coded, and the labeling of the most significant bits can follow another gray coding arrangement (or a quasi-gray coding arrangement if full gray coding is not possible) so that the Hamming distance between the most significant bits of adjacent cells is reduced or minimized. An example technique for assigning symbols to constellation points is described in U.S. Pat. No. 8,787,477 (which is hereby incorporated by reference). Regardless of the constellation used, LLR values for the least significant bits can be calculated and provided to the LDPC or other decoder 308. To enable uses in varying circumstances, the LLR calculator 306 could be configured to calculate LLR values for any constellation type that could be used to communicate symbols to the decoder 300.

Although FIGS. 6 through 9 illustrate examples of constellations that can be used during MLC for wireless or other communications, various changes may be made to FIGS. 6 through 9. For example, any other suitable constellation could be used with this MLC scheme. Also, the bit assignments shown in FIGS. 6 through 9 are illustrations only, and various other bit assignments could be obtained using the same or similar principles described above.

Note that in the above description, the LDPC codewords (or codewords generated using another higher-overhead encoding scheme) can be used by the second extractor 310 to facilitate generation of the BCH codewords (or codewords generated using another lower-overhead encoding scheme) that are then decoded by the second decoder 312. In some embodiments, the second extractor 310 can generate a reduced or "diluted" constellation that contains only the constellation points whose least significant bits match the LDPC decoded bits. The second decoder 312 could then select the point in the reduced constellation that is closest (such as in Euclidean distance) to a received symbol.

As an example, consider a square QAM used for MLC-2 decoding. A decoded LDPC codeword is used by the second extractor 310 to extract the input bits to the BCH decoder 312 from the received symbols. The input bits to the BCH decoder 312 can be determined by the nearest constellation point to the received symbol such that the least significant bits of the nearest constellation point match the corresponding bit(s) in the LDPC codeword.

By effectively "pre-processing" the constellation and removing constellation points that do not match the LDPC decoded bits, the BCH bit(s) can be extracted more efficiently. In the MLC-2 example, a received symbol can be scaled such that the reduced constellation points are at $\{-2^{q/2-1}+1, \ldots, -3, -1, +1, +3, \ldots, +2^{q/2-1}-1\}$. In particular embodiments, a lookup table that contains the most significant bit of the reduced constellation can be used. The lookup table could be a square matrix whose width is $2^{q/2-1}$. For 1024-QAM, for instance, the lookup table could represent a 16×16 matrix. If x and y are the closest constellation points in the reduced constellation to a received symbol, the corresponding codeword can be found at the lookup table index $(y-y_{min}) \times 2^{q/2-2} + (x-x_{min})/2$, where $x_{min} = y_{min} = -2^{q/2-1}+1$ (assuming that table indexing starts from zero). The arrangement of the codewords in the lookup table can be performed offline.

Now consider a square QAM used for MLC-4 decoding. The extraction of the BCH bits can be similar to the procedure described above, but there are now two least significant bits in each axis from the LDPC codeword rather than one. Therefore, the reduce constellation has a much smaller size, and the size of the lookup table is $2^{q/2-2} \times 2^{q/2-2}$. A received symbol can again be scaled such that the reduced constellation points are at $\{-2^{q/2-2}+1, \ldots, -3, -1, +1, +3, \ldots, +2^{q/2-2}-1\}$. If x and y are the closest constellation points in the reduced constellation to the received symbol, the corresponding codeword can be found at the lookup table index $(y-y_{min}) \times 2^{q/2-3} + (x-x_{min})/2$, where $x_{min}=y_{min}=-2^{q/2-2}+1$.

Although described above for square QAM, a similar approach can be developed for cross QAM, circular QAM, or other suitable modulation using a constellation. The general idea is to (i) dilute a constellation after LDPC decoding to keep only the constellation points whose least significant bits match the LDPC decoded codeword and (ii) extract at least one more/most significant bit(s) of the closest symbol in the diluted constellation. Appropriate mathematical algorithms can be developed depending on the shape of the original constellation.

Also note that, in the above description, it is assumed that the LDPC encoding/decoding is applied to the least significant bits of data. However, this is for illustration only. Any arbitrary subset of an input block can be selected and subjected to LDPC or other higher-overhead encoding/decoding, with the remainder of the input block subjected to BCH or other lower-overhead encoding/decoding (or no encoding/decoding). Similarly, the bit(s) extracted by the third extractor 314 could represent any suitable bit(s) and need not be the most significant bit(s) of data.

Among other things, the MLC approach described in this patent document provides a flexible choice between many levels of protection for different bits. For example, a flexible number of least significant bits can be subjected to the LDPC or other stronger coding, and the BCH or other weaker coding may or may not be multi-layered to provide different protection to different bits. Also, since only the least significant bits are passed to the LDPC or other stronger coding, this can significantly improve system speed and throughput when throughput is limited by LDPC decoding. For instance, with 1024-QAM constellations, subjecting only two bits to the LDPC coding could improve throughput by about five times or even more. Further, LLR calculations for the LDPC decoder can be modular and independent of constellation size. In addition, the use of a circular constellation can offer up to 1.4 dB or more improvement in the peak-to-average ratio in wireless communications.

In some embodiments, various functions described in this patent document are implemented or supported by a computer program that is formed from computer readable program code and that is embodied in a computer readable medium. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable memory device.

It may be advantageous to set forth definitions of certain words and phrases used throughout this patent document. The terms "application" and "program" refer to one or more computer programs, software components, sets of instructions, procedures, functions, objects, classes, instances, related data, or a portion thereof adapted for implementation in a suitable computer code (including source code, object code, or executable code). The terms "transmit," "receive," and "communicate," as well as derivatives thereof, encompasses both direct and indirect communication. The terms "include" and "comprise," as well as derivatives thereof, mean inclusion without limitation. The term "or" is inclusive, meaning and/or. The phrase "associated with," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, have a relationship to or with, or the like. The phrase "at least one of," when used with a list of items, means that different combinations of one or more of the listed items may be used, and only one item in the list may be needed. For example, "at least one of: A, B, and C" includes any of the following combinations: A, B, C, A and B, A and C, B and C, and A and B and C.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. A method comprising:
receiving input blocks each having multiple bits to be transmitted;
applying a first encoding scheme to a first subset of the bits in the input blocks to generate first encoded bits;
applying a second encoding scheme to a second subset of the bits in the input blocks to generate second encoded bits, the second encoding scheme having lower overhead than the first encoding scheme; and
generating symbols using the first and second encoded bits and uncoded bits of the input blocks;
in which the first encoded bits include two or more first bits per symbol of each output block; and
in which the second encoded bits include one or more second bits per symbol of each output block.

2. The method of claim 1, in which the first and second encoding schemes include different linear block coding schemes.

3. The method of claim 2, in which:
the first encoding scheme includes a low-density parity check (LDPC) coding;
the second encoding scheme includes a Bose, Chaudhuri and Hocquenghem (BCH) coding;
applying the first encoding scheme includes generating LDPC codewords; and
applying the second encoding scheme includes:
generating BCH codewords including a systematic part of the LDPC codewords; and
discarding portions of the BCH codewords associated with the first encoded bits.

4. The method of claim 1, including:
applying a third encoding scheme to a third subset of the bits in the input blocks to generate third encoded bits, the third encoded bits including one or more third bits per symbol of each output block.

5. The method of claim 1, in which generating the symbols includes mapping the first and second encoded bits to symbols of a circular quadrature amplitude modulation (QAM) constellation, the circular QAM constellation having 2×2 or 4×4 cells of constellation points.

6. An apparatus comprising:
a first encoder configured to apply a first encoding scheme to a first subset of bits from multiple input blocks to generate first encoded bits;
a second encoder configured to apply a second encoding scheme to a second subset of the bits in the input blocks to generate second encoded bits, the second encoding scheme having lower overhead than the first encoding scheme; and
a modulator configured to map the first and second encoded bits and uncoded bits of the input blocks to symbols for transmission; in which the first encoded bits include two or more first bits per symbol of each output block; and
in which the second encoded bits include one or more second bits per symbol of each output block.

7. The apparatus of claim 6, in which the first and second encoding schemes include different linear block coding schemes.

8. The apparatus of claim 7, in which:
the first encoding scheme includes a low-density parity check (LDPC) coding;
the second encoding scheme includes a Bose, Chaudhuri and Hocquenghem (BCH) coding;
the first encoder is configured to generate LDPC codewords; and the second encoder is configured to:
generate BCH codewords comprising including a systematic part of the LDPC codewords; and
discard portions of the BCH codewords associated with the first encoded bits.

9. The apparatus of claim 6, including a third encoder configured to apply a third encoding scheme to a third subset of the bits in the input blocks to generate third encoded bits, the third encoded bits including one or more third bits per symbol of each output block.

10. The apparatus of claim 6, in which the modulator is configured to map the first and second encoded bits to symbols of a circular quadrature amplitude modulation (QAM) constellation, the circular QAM constellation having 2×2 or 4×4 cells of constellation points.

11. A method comprising:
receiving symbols over a communication channel;
applying a first decoding scheme to decoding information obtained using the symbols to generate first decoded bits, the first decoded bits including two or more first bits of recovered data per symbol for each of multiple output blocks;
applying a second decoding scheme to codewords obtained using the symbols and the first decoded bits to generate second decoded bits, the second decoded bits including one or more second bits of recovered data per symbol for each of the output blocks, the second decoding scheme having lower overhead than the first decoding scheme;
extracting uncoded bits using the symbols to generate one or more third bits of recovered data per symbol for each of the output blocks; and
outputting the output blocks.

12. The method of claim 11, in which the first and second decoding schemes include different linear block coding schemes.

13. The method of claim 11, including applying a third decoding scheme to second codewords obtained using the symbols and the first and second decoded bits to generate one or more third bits of recovered data per symbol for each of the output blocks.

14. The method of claim 11, including:
prior to applying the second decoding scheme, diluting a constellation of symbols by removing any symbols from the constellation having bits that do not match the first decoded bits obtained using the first decoding scheme;
in which applying the second decoding scheme includes extracting second bits for a symbol in the diluted constellation that is closest to a received symbol.

15. The method of claim 11, in which the symbols include symbols of a circular quadrature amplitude modulation (QAM) constellation, the circular QAM constellation having 2×2 or 4×4 cells of constellation points.

16. An apparatus comprising:
a first decoder configured to receive symbols and apply a first decoding scheme to decoding information obtained using the symbols to generate first decoded bits, the first decoded bits including two or more first bits of recovered data per symbol for each of multiple output blocks;
a second decoder configured to apply a second decoding scheme to codewords obtained using the symbols and the first decoded bits to generate second decoded bits, the second decoded bits including one or more second bits of recovered data per symbol for each of the output blocks, the second decoding scheme having lower overhead than the first decoding scheme; and
a log-likelihood ratio (LLR) calculator configured to generate the decoding information from the received symbols.

17. The apparatus of claim 16, in which the first and second decoding schemes include different linear block coding schemes.

18. The apparatus of claim 16, including a third decoder configured to apply a third decoding scheme to second codewords obtained using the symbols and the first and second decoded bits to generate one or more third bits of recovered data per symbol for each of the output blocks, the third decoding scheme representing a weaker form of the second decoding scheme.

19. The apparatus of claim 16, in which the second decoder is configured to apply the second decoding scheme to generate one or more third bits of recovered data per symbol for each of the output blocks.

20. The apparatus of claim 16, in which:
the apparatus includes an extractor that is configured, prior to the second decoder applying the second decoding scheme, to dilute a constellation of symbols by removing any symbols from the constellation having bits that do not match the first decoded bits obtained using the first decoding scheme; and
the second decoder is configured to extract second bits from a symbol in the diluted constellation that is closest to a received symbol.

21. The apparatus of claim 16, in which the symbols include symbols of a circular quadrature amplitude modulation (QAM) constellation, the circular QAM constellation having 2×2 or 4×4 cells.

* * * * *